(12) United States Patent
Shilo et al.

(10) Patent No.: US 6,356,057 B1
(45) Date of Patent: Mar. 12, 2002

(54) METHODS AND APPARATUS FOR TESTING A POWERABILITY CHARACTERISTIC OF A BACKUP POWER SUPPLY

(75) Inventors: Marcel Shilo, Framingham, MA (US); Eamonn O'Reilly, Enniscorthy (IL)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/662,306

(22) Filed: Sep. 15, 2000

(51) Int. Cl.[7] .................. H02J 7/00; G01N 27/416

(52) U.S. Cl. ............................. 320/127; 702/85

(58) Field of Search .................. 320/124, 127–135; 324/522; 702/85; 429/90–93, 56, 61

(56) References Cited

U.S. PATENT DOCUMENTS 5,543,245 A * 8/1996 Andrieu et al. ............ 320/124
5,825,648 A * 10/1998 Karnowski ................ 364/187

* cited by examiner

Primary Examiner—Peter S. Wong
Assistant Examiner—Pia Tibbits
(74) Attorney, Agent, or Firm—Chapin & Huang, L.L.C.; David E. Huang

(57) ABSTRACT

The invention is directed to techniques for testing a powerability characteristic of a backup power supply for a computerized device using a discharge circuit that is different than circuitry of the computerized device. The discharge circuit is capable of draining float charge of the backup power supply thus enabling a measuring circuit to properly determine whether the backup power supply is suitable for providing the operating power to the computerized device for the predetermined amount of time in the event the computerized device no longer receives main power from the main power supply. One arrangement of the invention is directed to a computer system that includes a computerized device, a main power supply that provides power to the computerized device, a backup power supply coupled to the main power supply to receive charge from the main power supply. The backup power supply provides operating power to the computerized device for a predetermined amount of time in the event the computerized device no longer receives main power from the main power supply. The computer system further includes an apparatus that tests a powerability characteristic of the backup power supply. The apparatus includes a discharge circuit that connects to the backup power supply, and that is different than circuitry of the computerized device. The apparatus further includes a measuring circuit that measures, when the backup power supply is connected to the discharge circuit, an output signal of the backup power supply over time to determine whether the backup power supply is suitable for providing the operating power to the computerized device for the predetermined amount of time in the event the computerized device no longer receives main power from the main power supply.

17 Claims, 6 Drawing Sheets

METHODS AND APPARATUS FOR TESTING A POWERABILITY CHARACTERISTIC OF A BACKUP POWER SUPPLY

BACKGROUND OF THE INVENTION

Some computer systems include fault tolerant components. For example, a computer system may include a main power supply and a backup power supply. The backup power supply (also referred to as the battery backup unit of the computer system) powers the computer system for a period of time in the event the main power supply no longer powers the computer system (e.g., due to an external or internal power outage). That is, when the main power supply no longer powers the computer system, detection circuitry within the computer system (i) directs the backup power supply to power the computer system, and (ii) prompts the computer system to perform an emergency de-stage procedure. In response, the computer system continues operating until it reaches a safe stopping point (e.g., completes its current tasks, synchronizes volatile memory with non-volatile memory, closes files, etc.) and then shuts down in a controlled manner.

A typical backup power supply includes a set of charged batteries (or cells). Sealed lead-acid (SLA) batteries are commonly used in backup power supplies. In one configuration, as long as the main power supply remains in operation, the main power supply periodically charges the batteries. This prevents the batteries of the backup power supply from losing their charge over time.

Nevertheless, as the batteries of the backup power supply age over time, one or more batteries of a backup power supply may lose its ability to provide suitable charge (typically measured in units of Ampere-hours or Ah) to power the computer system long enough for the computer system to properly complete its tasks and shutdown. Accordingly, technicians periodically test backup power supplies.

There are two conventional approaches to testing a backup power supply: the open circuit voltage test approach and the forced online discharge approach. In the open circuit voltage test approach, the technician measures the output voltage of the backup power supply while the backup power supply is not being charged. If the backup power supply is configured to receive charge from the main power supply, the technician separates the backup power supply from the main power supply, and then attaches a volt meter across leads of the backup power supply. If the output voltage of the backup power supply is equal to or higher than a predetermined threshold (e.g., 50 volts), the technician concludes that the backup power supply operates properly and allows the backup power supply to continue backing up the main power supply. However, if the output voltage is less than the predetermined threshold, the technician concludes that the backup power supply is faulty and requires replacement (i.e., concludes that the backup power supply will not be able to properly power the computer system in the event the main power supply no longer powers the computer system).

In a first version of the forced online discharge approach, the technician disconnects or deactivates the main power supply (e.g., unplugs the main power supply from the main source, turns off the main power supply, disconnects the main power supply from the computer system, etc.). If the backup power supply operates properly, the backup power supply powers the computer system (in response to control signals from detection circuitry) enabling the computer system to properly complete its current tasks and shutdown. However, if the backup power supply is incapable of adequately powering the computer system, the computer system stops abruptly or crashes due to the lack of power thus signaling the technician that a replacement backup power supply is required.

In a second version of the forced online discharge approach, the technician lowers the output voltage of the main power supply (e.g., from 56 volts to 42 volts) and prevents the main power supply from providing charge to the backup power supply. The technician then allows the backup power supply to power the computer system (i.e., discharge through the computer system) while measuring the output voltage of the backup power supply in order to determine whether the backup power supply operates properly. A gradual drop in output voltage indicates that the backup power supply operates properly, but a quick drop in output voltage indicates that the backup power supply does not operate properly.

SUMMARY OF THE INVENTION

Unfortunately, there are deficiencies to the above-described conventional approaches for testing backup power supplies. For example, in the conventional open circuit voltage test approach, the backup power supply may pass the output voltage test performed by a technician. That is, the backup power supply may provide an adequate output voltage, i.e., an output voltage that is higher than a predetermined threshold, when a technician tests the backup power supply. However, the backup power supply may be incapable of powering the computer system for an amount of time necessary for the computer system to complete its current tasks and shutdown. One reason is that batteries within the backup power supply may have a float charge that is capable of sustaining an output voltage that equals or exceeds the predetermined threshold for less than a few seconds. Accordingly, the backup power supply may appear to be fully charged and seem as though it possesses the capacity to power the computer system for a substantial time period in the event of a power loss when, in reality, the backup power supply can only power the computer system for a few seconds. In particular, once the float charge is removed (e.g., after the backup power supply powers the computer system for a few seconds), the backup power supply provides little or no charge. As a result, in the event the main power supply no longer powers the computer system, the backup power supply may power the computer system for a short period of time (e.g., a few seconds) before the computer system crashes (i.e., before the computer system can complete its current tasks and shutdown properly).

In the first version of the conventional forced online discharge approach, the computer system drains the charge on the backup power supply. The computer system then either remains in operation to complete its current tasks and properly shut down in a controller manner if the backup power supply is good, or crashes if the backup power supply is faulty. A computer system crash is an undesirable situation and is generally perceived as a catastrophic malfunction since computer systems can sustain damage when abruptly powered down in an uncontrolled state. For example, a head disk assembly may inadvertently corrupt or erase important data on a disk if the disk is allowed to operate in an uncontrolled state and the power supply is abruptly removed. As another example, a computer system may lose valuable information stored in volatile semiconductor memory (e.g., a RAM memory cache) which has not yet been synchronized to non-volatile disk memory).

In the second version of the forced online discharge approach (e.g., dropping the output voltage of the main power supply from 56V DC to 42 V DC and preventing the main power supply from charging the backup power supply), the main power supply eventually powers the computer system once the output voltage of the backup power supply drops to the same output voltage as that provided by the main power supply. When this occurs, a tremendous stress is placed on the main power supply since the main power supply attempts to provide the same power or wattage to the computer system by substantially increasing its output current. In particular, the quantified current stress is the squared ratio of currents (computable using voltage values), e.g., $(56V/42V)^2$ equaling $(1.333)^2$ or 1.777, which is considered too high a stress to place on the main power supply for testing the backup power supply in the field. Such stressful operation risks heavily damaging the main power supply, as well as risks crashing the computer system if the main power supply burns out. Accordingly, the second version of the forced online discharge approach is a poor approach for testing the backup power supply.

In contrast to the above-described conventional approaches to testing a backup power supply, the invention is directed to techniques for testing a powerability characteristic of a backup power supply for a computerized device using a discharge circuit that is different than circuitry of the computerized device. The discharge circuit is capable of draining the float charge of the backup power supply thus enabling a measuring circuit to subsequently determine whether the backup power supply is suitable for providing operating power to the computerized device for a predetermined amount of time in the event the computerized device no longer receives main power from the main power supply. Such techniques are sufficient to discover even one malfunctioning or "empty" cell masked by float charge within a backup power supply (e.g., a battery backup unit) containing several cells (e.g., 24 cells).

One arrangement of the invention is directed to a computer system that includes a computerized device, a main power supply that provides power to the computerized device, and a backup power supply coupled to the main power supply to receive charge from the main power supply. The backup power supply provides operating power to the computerized device for a predetermined amount of time in the event the computerized device no longer receives main power from the main power supply. The computer system further includes an apparatus that tests a powerability characteristic of the backup power supply (i.e., the capacity to power the computerized device for a predetermined time period). The apparatus includes a discharge circuit that connects to the backup power supply, and that is different than circuitry of the computerized device. The apparatus further includes a measuring circuit that measures, when the backup power supply is connected to the discharge circuit, an amount of time that the backup power supply provides an output signal meeting a predetermined criterion in order to determine whether the backup power supply is suitable for providing operating power to the computerized device for a predetermined amount of time in the event the main power supply no longer powers the computerized device.

In one arrangement, the discharge circuit includes a heating coil assembly that, when connected to the backup power supply, forms a closed circuit with the backup power supply. Preferably, the discharge circuit further includes a fan assembly that, when connected to the backup power supply, forms a closed circuit with the backup power supply such that the fan assembly provides an air stream across the heating coil assembly to cool the heating coil assembly.

In one arrangement, the measuring circuit includes a voltage detection circuit, and a computer coupled to the voltage detection circuit. The computer is configured to record an amount of time the backup power supply powers the discharge circuit while the backup power supply provides an output voltage that exceeds (or equals) a predetermined voltage threshold (e.g., 50 volts). In this arrangement, the output voltage provided by the backup power supply is the measured output signal of the backup power supply.

In one arrangement, the computer includes memory having a database that stores amounts of time for other backup power supplies powering discharge circuits while the other backup power supplies provide output voltages over the predetermined voltage threshold, and a processor coupled to the memory. Accordingly, the computer can be configured to collect data regarding backup power supply performance for subsequent testing refinement and development.

In one arrangement, the computer is configured to record a first time measurement when the discharge circuit connects to the backup power supply and when the output voltage of the backup power supply exceeds the predetermined voltage threshold, and record a second time measurement when the output voltage no longer exceeds (or equals) the predetermined voltage threshold. The computer is configured to then generate a difference between the first and second time measurements. The difference is an amount of time the backup power supply powered the discharge circuit while the backup power supply provided an output voltage over the predetermined voltage threshold.

The features of the invention, as described above, may be employed in computer systems, tests devices and procedures, and other computer-related techniques such as of EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for testing a powerability characteristic of a backup power supply for a computerized device using a discharge circuit that is different than circuitry of the computerized device. The discharge circuit is capable of draining float charge of the backup power supply thus enabling a measuring circuit to properly determine whether the backup power supply is suitable for providing the operating power to the computerized device for the predetermined amount of time in the event the computerized device no longer receives main power from the main power supply. For example, the technique can expose the existence of a single "empty" cell masked with float charge in a backup power supply containing multiple cells (e.g., 24 cells). The techniques of the invention may be used in computer systems, devices and procedures such as those of EMC Corporation of Hopkinton, Mass.

Figure 1:
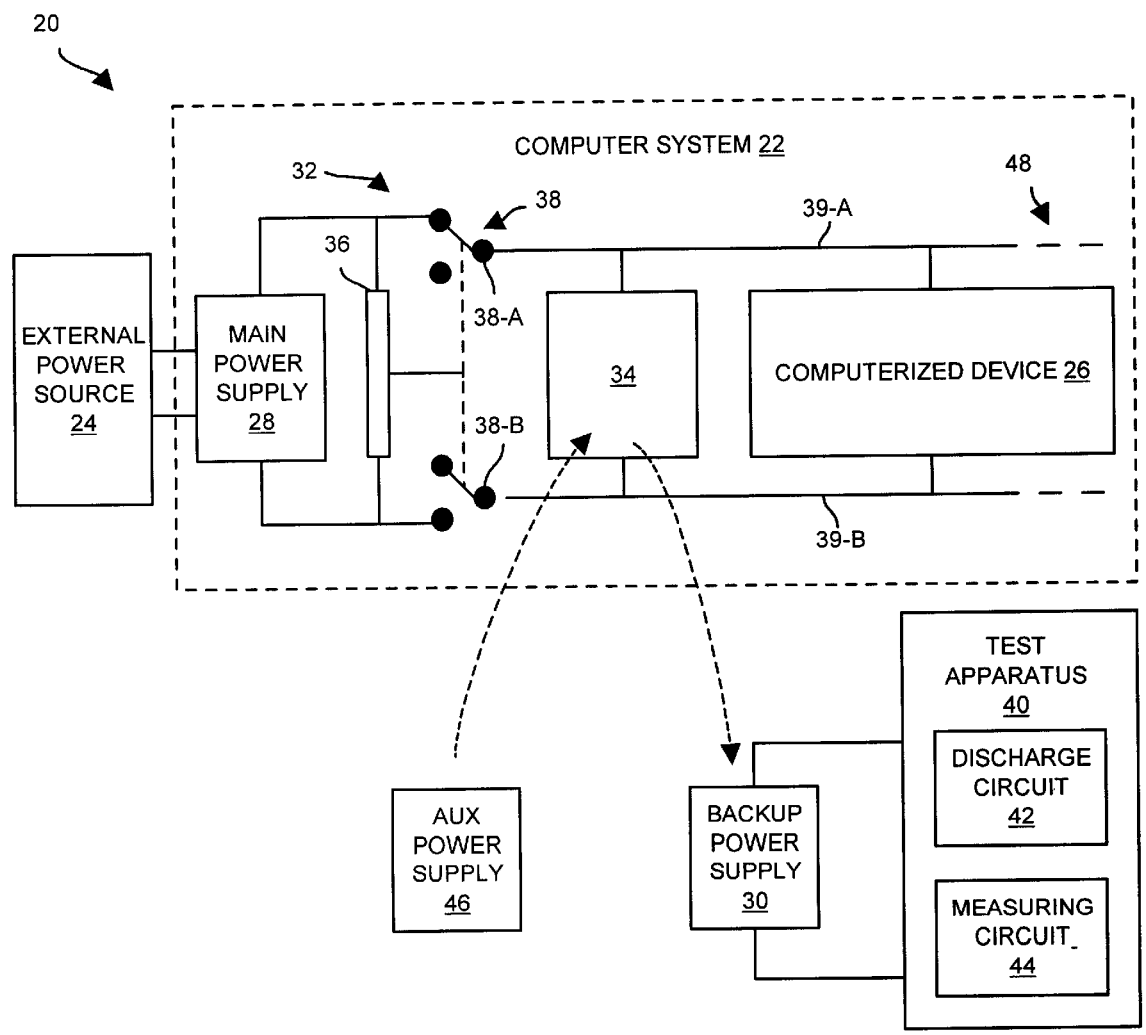
FIG. 1 is a block diagram of a system for testing a powerability characteristic of a backup power supply which is suitable for use by the invention.

FIG. 1 shows a connection configuration 20 which is suitable for use by the invention. The arrangement 20 includes a computer system 22 and an external power source 24 (e.g., a power plant). The computer system 22 (e.g., a data storage system) includes a computerized device 26 (e.g., an array of disk drives, etc.), a main power supply 28, a backup power supply 30 (or battery backup unit), and a detection circuit 32. In contrast to the main power supply 28 which powers the computerized device 26 in response to the external power source (e.g., converts DC from AC provided by the external power source), the backup power supply 30 stores charge at a location 34 (e.g., in rechargeable batteries or cells) for emergency use. That is, the backup power supply 30 powers the computerized device 26 in the event that main power supply 28 no longer powers the computerized device 26.

By way of example only, suppose that the computer device 26 is configured to operate at 48 volts. For this arrangement, the backup power supply 30 can be constructed from four 12 volt battery blocks connected in series. In one arrangement, the batteries are slightly overcharged such that the backup power supply 30 actually provides, at least initially, 54 volts (e.g., approximately 13.5 volts from each battery block).

The detection circuit 32 includes a sensing circuit 36, coupled to the main power supply, and a switch 38. When the sensing circuit 36 determines that the main power supply no longer powers the computerized device 26, the sensing circuit 36 disconnects the main power supply 28 from the rest of the computer system 22 (e.g., by activating subswitches 38-A and 38-B) thus allowing the backup power supply 30 to power the computerized device 26 through power supply connections 39-A and 39-B (power supply rails, buses, cables, etc.). It should be understood that other devices 48 (e.g., processors, interfaces, etc.) can be connected to the main power supply 28 and the backup power supply 30 as well.

It should be understood that the backup power supply 30 is testable using a test apparatus 40 which includes a discharge circuit 42 and a measuring circuit 44. As illustrated in FIG. 1, the discharge circuit 42 is different than circuitry of the computerized device 26. The test apparatus 40 is capable of measuring an amount of time that the backup power supply provides an output signal meeting a predetermined criterion (e.g., an output voltage exceeding a predetermined threshold) in order to determine whether the backup power supply 30 is suitable for providing operating power to the computerized device 26 for a predetermined amount of time in the event the main power supply 28 no longer powers the computerized device 26.

Optionally, as shown in FIG. 1, an auxiliary power supply 46 can be connected to the computer system 22 to backup the main power supply 28 while the backup power supply 30 is tested by the test apparatus 40. This provides power supply redundancy for the computer system 22 while the backup power supply 30 is tested. Further details of the computer system 22 will now be provided with reference to FIG. 2.

Figure 2:
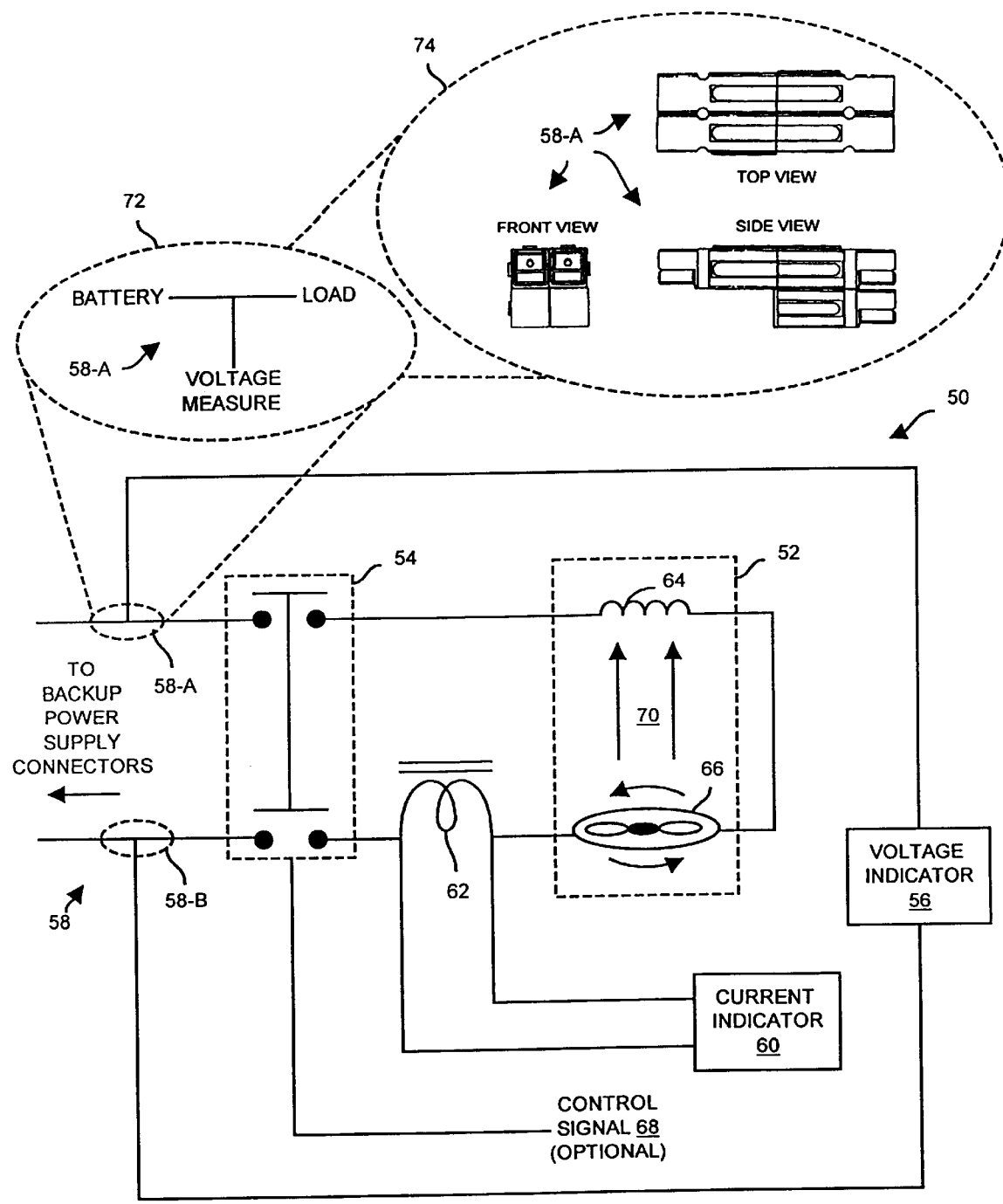
FIG. 2 is a block diagram of a portion of a test apparatus of FIG. 1.

FIG. 2 shows a circuit 50 which is suitable for use as part of the test apparatus 40 of FIG. 1. The circuit 50 includes a load 52, a switch 54, a voltage indicator 56, "T" connections 58-A, 58-B (collectively, "T" connections 58), a current indicator 60, and a sensor 62 (e.g., a non-contact sensor such as a magnetic or Hall Effect device). The load 52 includes a heating coil 64 and a fan assembly 66, which combine to form at least a portion of the discharge circuit 42 (see FIG. 1). The switch 54 is optionally controllable by a control signal 68.

During operation of the test apparatus 40, the switch 54 (e.g., in response to the control signal 68) connects the load 52 to connectors or leads of the backup power supply 30, and the load 52 drains charge from the backup power supply 30. In particular, as current passes through the load 52, the heating coil 64 generates heat and the fan assembly 66 provides an air stream 70 that cools the heating coil 64. In one arrangement, the heating coil 64 releases its heat into an area that receives cooling from other components of the computer system 22 (e.g., the air stream that cools the computerized device 26).

It should be understood that the combination of the heating coil 64 and the fan assembly 66 provides a controlled and sustainable current draw that, in some respects, is superior to large and heavy standard kW range resistors that would be prone to overheating when used in such a situation. Nevertheless, other types of loads (including standard resistors) can be used in the load 52.

Figure 3:
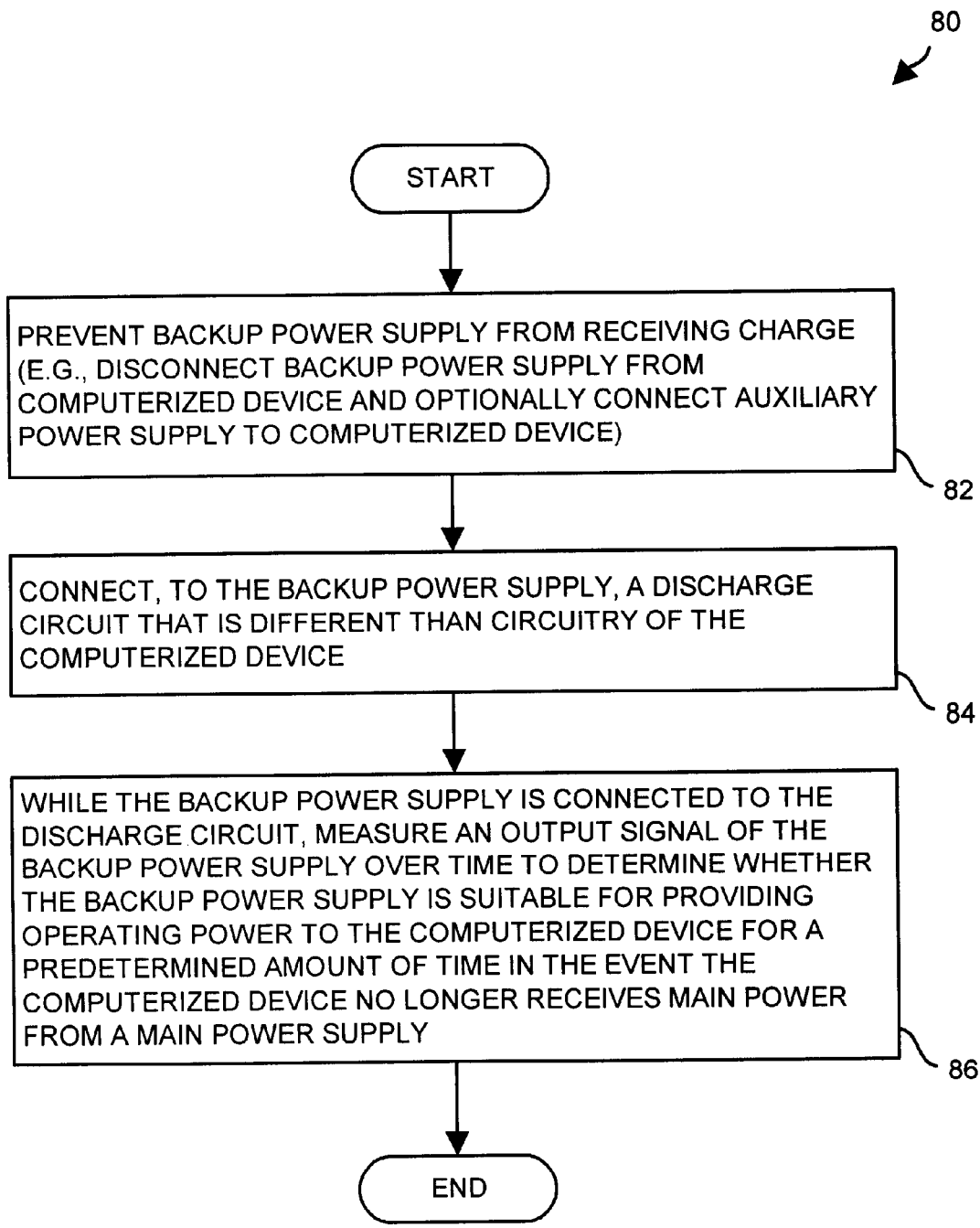
FIG. 3 is a flow diagram illustrating a procedure for testing the powerability characteristic of the backup power supply of FIG. 1.

It should be understood that each "T" connection 58 connects an end of the load 52, an end of the voltage indicator 56 and a lead to the battery as shown in the magnified view 72 of FIG. 3. In one arrangement, the "T" connection 58 is formed by a specialized "T" connector 74 that mates with other connectors and/or cables respectively leading to load 52, the voltage indicator 56 and the backup power supply 30.

Connectors similar to the "T" connector 74 can be used to couple the auxiliary power supply 46 to the computer system 22 while the technician tests the backup power supply 30. Such connectors can be customized and sized to suitably carry an amount of current required by the computer system 22 (e.g., 50 amps for a half-bay array of disk drives, 75 amps for a single-bay array of disk drives, 120 amps for a 3-bay array of disk drives, etc.). Further details of how the test apparatus 40 of FIGS. 1 and 2 operates will now be provided with reference to FIG. 3.

FIG. 3 shows a flow chart of a procedure 80 which is performed by a technician when testing the backup power supply 30. In step 82, the technician prevents the backup power supply 30 from receiving charge. In one arrangement, the technician disconnects (e.g., un-cables) the backup power supply 30 from the computer system 22. Optionally, the technician connects the auxiliary power supply 46 in place of the backup power supply 30 to backup the main power supply 28 while the backup power supply is disconnected.

In step 84, the technician connects the discharge circuit 42 to the backup power supply 30. In one arrangement, the "T" connections 58 are formed using the "T" connectors 74 (see FIG. 2) and the technician mates the "T" connectors 74 with other connectors to join the test apparatus 40 with the backup power supply 30.

In step 86, the technician measures an output signal of the backup power supply 30 over time in order to determine whether the backup power supply 30 is suitable for providing operating power to the computerized device 26 for a predetermined amount of time (e.g., 3 minutes) in the event the computerized device 26 no longer receives main power from the main power supply 28. The technician preferably takes the voltage measurements while the discharge circuit 42 (see load 52) is connected to the backup power supply 30. The technician takes such measurements over time in order to allow the discharge circuit 42 to remove any float charge existing on the backup power supply 30 since the float charge may provide a high voltage (e.g., 54 volts) even though the backup power supply 30 is incapable of providing current at 50 volts to the discharge circuit 42 for any extended period of time. After several seconds (e.g., 3 seconds), the float charge is removed, and the technician can measure the output voltage of the backup power supply 30 in the absence of any float charge. In one arrangement and by way of example only, a backup power supply 30 which is capable of powering the computerized device 26 long enough for the computerized device 26 to complete its current tasks and properly shutdown initially provides approximately 54 volts and continues to provide at least 50 volts for at least 30 seconds from the time the technician connects the discharge circuit 42 to the backup power supply 30. Details of an enhancement to the configuration 20 will now be provided with reference to FIG. 4.

Figure 4:
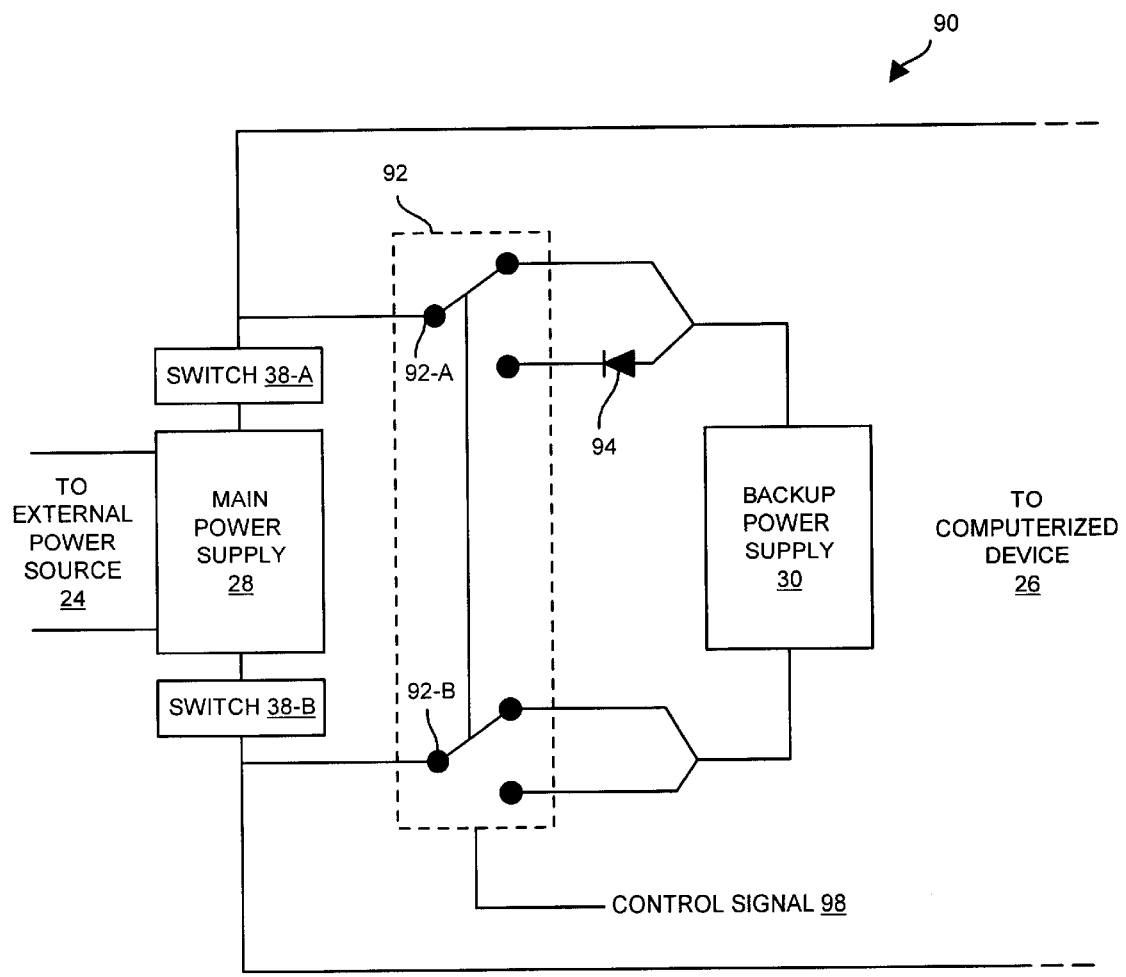
FIG. 4 is a block diagram of an arrangement for preventing charging of the backup power supply which is suitable for use as an alternative to physically removing a cable to disconnect the backup power supply of FIG. 1.

FIG. 4 shows a connection configuration 90 which is suitable for use at location 34 of the computer system 22 of FIG. 1 to enable the backup power supply 30 to remain connected within the computer system 22 when a technician tests the backup power supply 30. The configuration 90 includes switches 92-A, 92-B which operate together, and a diode 94.

During normal operation of the computerized device 26, the switches 92-A, 92-B are in the positions shown in FIG. 4 to allow the main power supply 28 to power the computerized device 26, as well as provide charge to the backup power supply 30. If the main power supply 28 no longer powers the computerized device 26 (e.g., due to inavailability of the external power source 24), the backup power supply 30 powers the computerized device 26 in the manner described earlier.

To test the backup power supply 30, the technician activates the switches 92-A and 92-B such that the diode 94 (i) allows the backup power supply 30 to discharge through the computerized device 26 in the event of a failure of the main power supply 28, and (ii) prevents the backup power supply 30 from being charged by the main power supply 28. That is, the diode 94 is reversed biased such that the main power supply 28 cannot charge the backup power supply 30. Accordingly, the technician can attach the test apparatus 40 to the backup power supply 30 and test the backup power supply 30 without interference from the main power supply 28. To this end, the technician measures the amount of time that the backup power supply 30 provides an output signal meeting a predetermined criterion (e.g., an output voltage equal to or exceeding 50 volts) while the discharge circuit 42 is connected to the backup power supply 30 in a manner similar to that described earlier.

It should be understood that the backup power supply 30 continues to backup the main power supply 28 during the test. In particular, if the main power supply 28 no longer powers the computerized device 26 (e.g., due to inavailability of the external power source 24), the backup power supply 30 powers the computerized device 26 through the diode 94 which is then properly forward biased such that the backup power supply 30 provides direct current through the diode 94 to the computerized device 26. Accordingly, the configuration 90 provides backup to the main power supply 28 while alleviating the need for the auxiliary power supply 46 (see FIG. 1). Further details of the measuring circuit 44 will now be provided with reference to FIG. 5.

Figure 5:
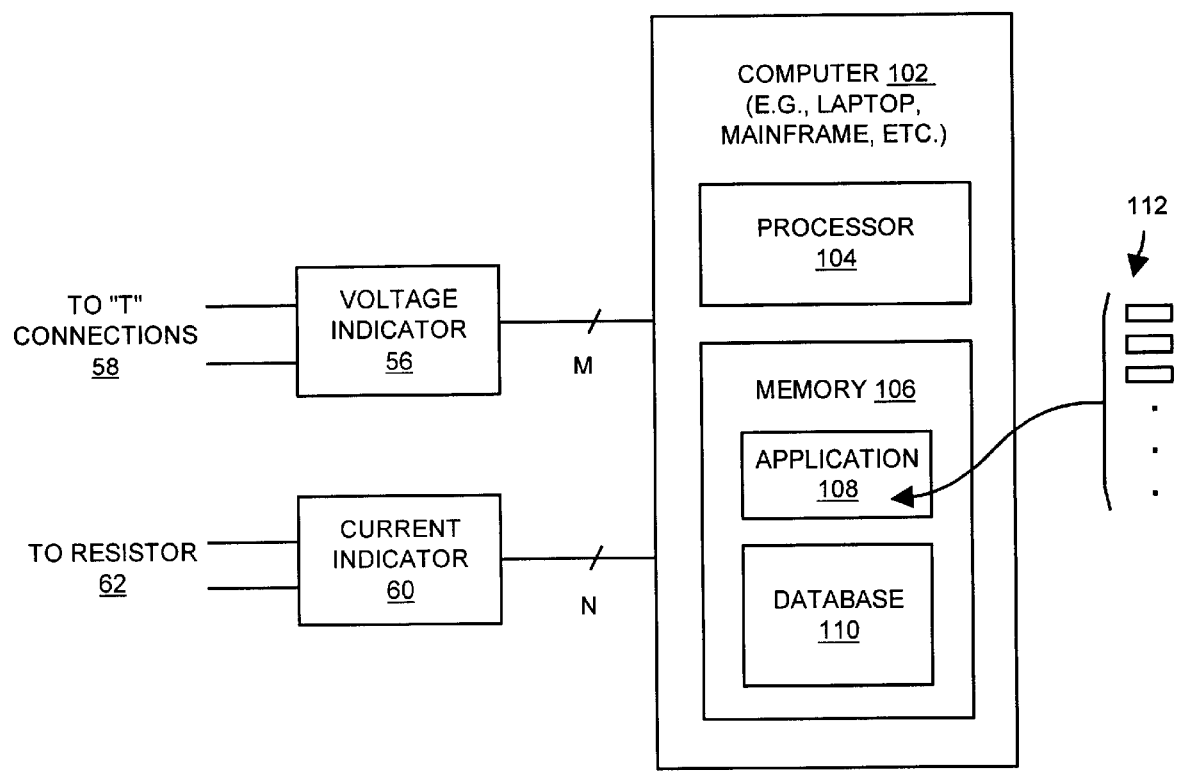
FIG. 5 is a block diagram of a computer which is suitable for controlling testing of the powerability characteristic when using the system of FIG. 1.

FIG. 5 shows a configuration 100 which is suitable for use as the measuring circuit 44 of FIG. 1. The measuring circuit 44 includes the voltage indicator 56 leading to the "T" connections 58 (also see FIG. 2), a current indicator 60 leading to the sensor 62 (FIG. 2), and a computer 102 (e.g., a portable laptop computer). In one arrangement, the computer 102 connects with the voltage indicator 56 through bus having M lines (M being a positive integer), and connects with the current indicator 60 through another bus having N lines (N being a positive integer).

The computer 102 includes a processor 104 and memory 106. The memory 106 includes an application 108 and a database 110. The application 108 includes instructions 112 which, when performed by the processor 104, configure the computer 102 to record the amount of time the backup power supply 30 powers the discharge circuit 42 while the backup power supply 30 provides an output voltage over a predetermined voltage threshold (e.g., 50 volts). Further details of the operation of the computer 102 will now be provided with reference to FIG. 6.

Figure 6:
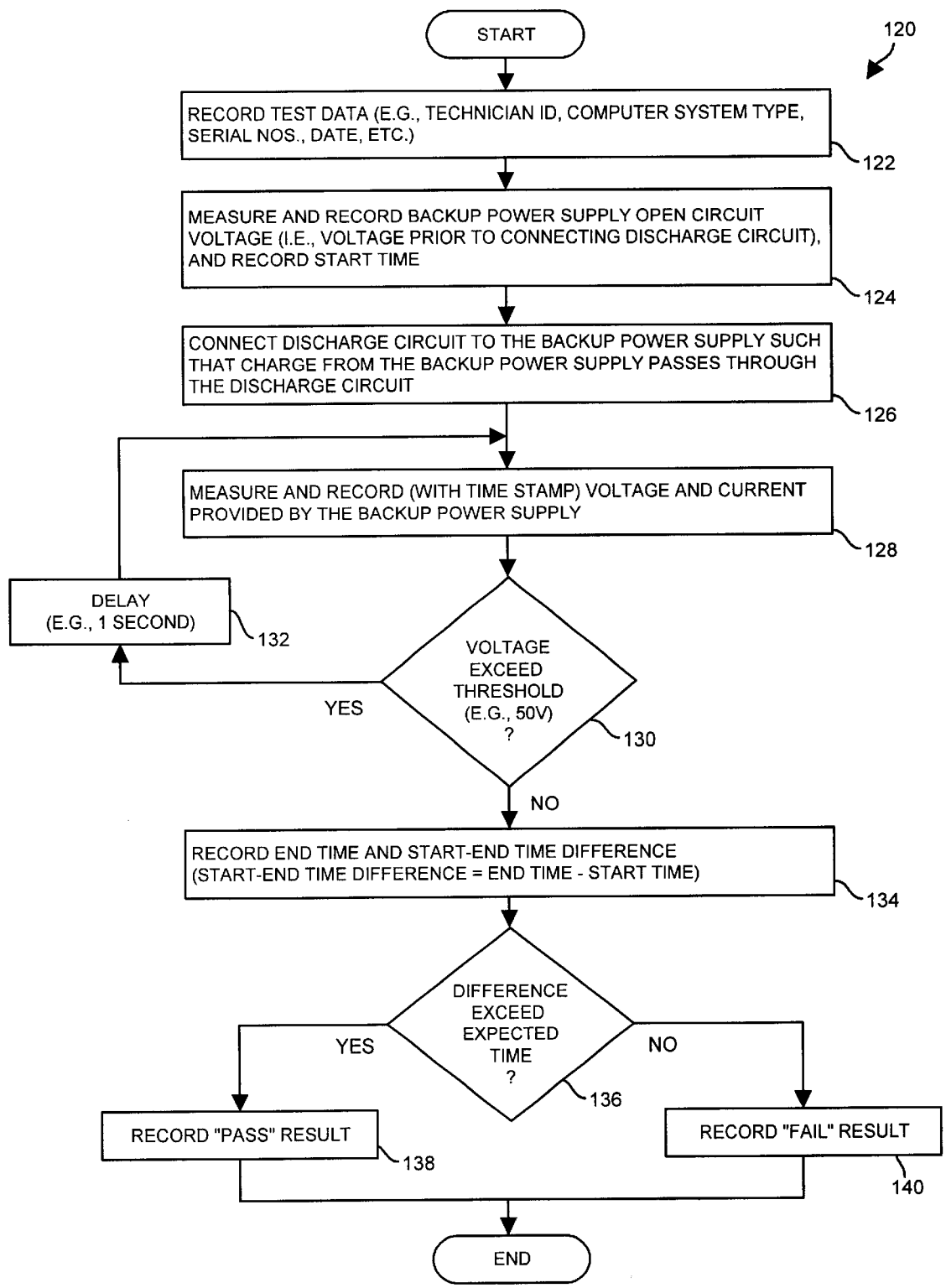
FIG. 6 is a flow diagram illustrating a procedure performed by the computer of FIG. 5 when performing the test of the powerability characteristic.

FIG. 6 shows a flow chart of a procedure 120 which is performed by the computer 102 while operating in accordance with the application 108. Preferably, the computer is capable of repeating the procedure 120 on different computer systems 22 in an automated and standardized manner.

In step 122, the computer 102 records test data in the database 110. Such data can include an identifier of the technician that is testing the backup power supply 30, the type of computer system 22 or computerized device 26 (e.g., a half bay disk storage system, a full bay disk storage system, a 3-bay disk storage system, etc.), a serial number of the computer system 22 (e.g., identifying the customer, sources of components, etc.), and the date.

In step 124, the computer 104 measures and records (in the database 110) the open circuit voltage of the backup power supply 30 (i.e., prior to connecting the discharge circuit 42 to the backup power supply 30, also see FIG. 1). The open circuit voltage is also referred to as the "float" voltage. Additionally, the computer 104 records a start time (e.g., saves a current time stamp from a time-of-year clock, initializes a counter, etc.). When using simple counting devices for providing time, the simple counting devices are preferably adapted to provide consistent times regardless of the rate of any AC power sources (e.g., 50 Hz, 60 Hz, etc.).

In step 126, the computer 104 connects the discharge circuit 42 to the backup power supply 30 such that charge from the backup power supply passes through the discharge circuit 42. For example, in connection with FIG. 2, the computer 104 provides the control signal 68 to activate the switch 54 thus discharging the backup power supply 30 through the load 52.

In step 128, the computer 104 measures and records the output voltage and current provided by the backup power supply 30 and an associated time (e.g., a current time stamp, counter contents, etc.).

In step 130, the computer 104 compares the measured output voltage with a predetermined threshold (e.g., 50 volts). If the measured output voltage exceeds (or equals) the predetermined threshold, the computer 104 proceeds to step 132. Otherwise, the computer 104 proceeds to step 134.

In step 132, the computer 104 delays or waits a predetermined amount of time (e.g., one second). Then, the computer 104 proceeds back to step 128 to re-measure and record the output voltage and current (and associated time) of the backup power supply 30.

In step 134, the computer 104 records an end time (i.e., the time that the measured output voltage fell below the predetermined threshold) and the time difference between the start and end times. The difference is the amount of time the backup power supply 30 provided current through the discharge circuit 42 (see load 52 in FIG. 2) while outputting an output voltage that exceeded the predetermined threshold.

In step 136, the computer 104 compares the difference to a predetermined or expected time (e.g., 30 seconds). If the difference exceeds (or equals) the predetermined time, the computer 104 proceeds to step 138. If not, the computer 104 proceeds to step 140.

In step 138, the computer 104 records a "PASS" result for the test since the time difference exceeded or equaled the predetermined time, i.e., the backup power supply 30 provided current through the discharge circuit 42 while outputting an output voltage that exceeded the predetermined threshold for a suitable amount of time.

In step 140, the computer 104 records a "FAIL" result for the test since the time difference fell below the predetermined time, i.e., the backup power supply 30 did not provide current through the discharge circuit 42 while outputting an output voltage that exceeded the predetermined threshold for a suitable amount of time.

The results of the procedure 120 can be compiled in a master database (e.g., the database 110 of FIG. 5) for creation of standard pass/fail criteria or specifications. Accordingly, such criterion can be refined over time as additional test results are accumulated.

Once the results have been generated, the computer 102 can signal that the test has been completed. At that point, the technician can disconnect the load 52 from the backup power supply 30, or in the case of the computer 102 providing the control signal 68 to the switch 54 (see FIG. 2), the computer 102 can actuate the switch 54 to disconnect the load 52 from the backup power supply 30 in an automated manner. Once the backup power supply 30 is re-connected or reinstalled within the computer system 22, the backup power supply 30 can, again, be recharged and provide backup protection in a normal manner.

As described above, the invention is directed to techniques for testing a powerability characteristic of a backup power supply for a computerized device using a discharge circuit that is different than circuitry of the computerized device. The discharge circuit is capable of draining float charge of the backup power supply thus enabling a measuring circuit to properly determine whether the backup power supply is suitable for providing the operating power to the computerized device for the predetermined amount of time in the event the computerized device no longer receives main power from the main power supply.

In one arrangement, the test apparatus 40 is portable and easy-to-use (e.g., automated using a laptop computer), and capable of being duplicated in large numbers. Additionally, the test procedure 120 is easy to rerun, requires little or no calibration, and has no backwards compatibility problems.

It should be understood that with the invention, the backup power supply 30 is tested after the float charge is removed. Accordingly, the technician will not inadvertently deem the backup power supply 30 as "good" by testing only the float charge as in the conventional open circuit voltage test approach. Furthermore, since the backup power supply 30 is tested using a discharge circuit 42 that is different than the computerized device 26, there is no possibility of crashing the computerized device 26 by drawing away all the charge from the backup power supply 30 during testing as in the conventional forced online discharge approach in which the main power supply is disconnected so that the computer system relies solely on the backup power supply. The techniques of the invention may be used in data storage systems, devices and procedures and other computer-related mechanisms such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, its should be understood that the computer system 22 was described above as a data storage system, and the computerized device 26 was described above as an array of disks by way of example only. Such a data storage system is the Symmetrix which is manufactured by EMC Corporation of Hopkinton, Mass. In alternative arrangements, the computer system 22 can perform other functions (e.g., operate as a general purpose computer, real-time controller, etc.). Additionally, the computerized device 26 can take the form of other types of hardware (e.g., a processor, a network interface, an input device, an output device, etc.).

Furthermore, it should be understood that each of the computer system components (i.e., the main power supply 28, the backup power supply 30, the computerized device 26, etc.) can reside in a single cabinet (e.g., a laptop, a mainframe cabinet, etc.) or in separate locations (multiple cabinets).

In one arrangement, in which the technician connects the auxiliary power supply 46 to the computer system 22 when testing the backup power supply 30, there is no distinction between the backup power supply 30 and the auxiliary power supply 46. That is, when a technician arrives at the computer system 22 to test the backup power supply 30, the technician brings another backup power supply as the auxiliary power supply 46.

However, in another arrangement, the auxiliary power supply 46 is different than the backup power supply 30. For example, the auxiliary power supply 46 can be a lighter-weight, specialized portable power supply with less capacity than the backup power supply 30. Nevertheless, in this arrangement, the auxiliary power supply 46 can be configured to provide enough charge to properly power the computer system 22 in the event the main power supply 28 no longer powers the computer system 22 while the technician tests the backup power supply 30.

Additionally, it should be understood that the test apparatus 40 can be portable and carried by the technician (e.g., a trained field service person) to multiple computer system sites to test backup power supplies 30 at those sites. Alternatively, at least a portion of the test apparatus 40 (e.g., the load 52, switch 54, voltage indicator 56 and current indicator 60 of FIG. 2) can be integrated or built into the computer system 22. As such, the technician can utilize these components by visiting the computer system site, or remotely (e.g., connecting through a network connection or phone line).

Furthermore, it should be understood that the switch 54 (see FIG. 2) was described above as being controlled by the control signal 68 by way of example only. Other configurations are suitable for the invention. For example, the switch 54 can be a manually operated switch. In such a situation, the technician manually actuates the switch 54 to connect the load 52 to the backup power supply 30.

Additionally, it should be understood that the load 52 was described above as including the heating coil 64 and the fan assembly 66 by way of example only. A conventional hairdryer is a suitable off-the-shelf component for the load 52 which is simple, portable and easy-to-use. Other types of loads are suitable as well (simply a fan, a resistor, motor, etc.). Preferably, the load 52 includes circuitry that provides a substantial drain on the backup power supply 30 in order to remove any float charge from the backup power supply 30 in a short period of time (e.g., 5 to 30 seconds).

Furthermore, it should be understood that the computer 102 (see FIG. 5) which operates in accordance with the application 108 to measure and record data from the backup power supply 30 in the database 110, was described above as a portable laptop computer by way of example only. In an alternative arrangement, the computer 102 is a combination of a laptop computer which the technician (a field service person) carries to the computer system 22, and a mainframe located at a centralized location or headquarters for combining and processing test results accumulated by the laptops of multiple technicians. In yet another alternative arrangement, the discharge circuit 42 and a portion of the measuring circuit 44 (e.g., the voltage indicator 56 and the current indicator 60) of the test apparatus 40 (also see FIG. 1) are integrated with the computer system 22 (e.g., permanently located at the site of the computer device 26 such as within the same cabinet) and the computer 102 is located at a centralized location. Here, the computer 102 connects to the discharge circuitry 42 remotely (e.g., through a phone line or other network connection) to operate the discharge circuitry and to obtain and record measurements.

Also, it should be understood that the techniques of the invention are suitable for testing backup power supplies 30 having a variety of different types of batteries or cells. For example, in one arrangement, the backup power supply 30 includes sealed lead-acid batteries.

Additionally, in connection with the arrangements that do not have the backup power supply 30 connected to the computerized device 26 for backup power protection during testing of the backup power supply 30 as in FIG. 4, it should be understood that use of the auxiliary power supply 46 optional. In some arrangements the auxiliary power supply 46 is not used. For example, in one arrangement, the computer system 22 has no backup while the technician tests the backup power supply 30. Although there is a risk of a power failure during the test, the amount of total time required for the test is generally short (e.g., less than five minutes) thus making the chances of requiring backup power during the test minimal. Nevertheless, most computer system sites have periodic times in which the computer systems are in a "safe mode" and available for maintenance (e.g., all critical information is safely stored and backed up), and the such times are the most suitable times for the technician to test the backup power supply 30 without the use of the auxiliary power supply 46.

Furthermore, in some arrangements, the computer system 22 includes multiple backup power supplies 30 (e.g., in large configurations such as 3-bay disk drive arrays).

In such arrangements, backup power may be available during a test of the backup power supply 30 without the auxiliary power supply 46. For example, suppose that the computer system 22 includes two backup power supplies 30. Here, the technician can disconnect the first backup power supply 30 for testing while leaving the second to provide backup power in the case of an emergency. Then, the technician can reconnect the first and disconnect the second for testing. Loss of power from the main power supply 28 while only one backup power supply 30 is connected may still power the computer system 22 long enough (e.g., 30 seconds) for the technician to react (e.g., reconnect the other backup power supply 30.

Additionally, it should be understood that the techniques of the invention have applications other than just testing operating backup power supplies of functioning systems in the field. For example, in some situations, new backup power supplies can be in short supply, e.g., perhaps there are not enough backup power supplies to meet the demand for backup power supplies in new system installations. In such situations, older generation backup power supplies can be reworked and/or reconfigured as necessary to operate, at least temporarily, as backup power supplies for the new installations until suppliers can catch up with the demand. The techniques of the invention can be used to test (either at a manufacturing facility or in at the new installation site) such older generation backup power supplies to insure they will properly backup the main power supplies of the new installations during the interim. In particular, the powerability characteristics of an older generation backup power supply for a newly installed computerized device can be tested using a discharge circuit that is different than circuitry of the computerized device. Accordingly, the techniques of the invention do not depend on the conventional practices and procedures employed by the conventional forced online discharge approach (e.g., discharging the backup power supply through the existing computer system) and the open circuit voltage test approach (e.g., measuring the output of the backup power supply without any load). Such modifications and enhancements are intended to be within the scope of the invention.

What is claimed is:

1. A method for testing a powerability characteristic of a backup power supply for a computerized device that is coupled to a main power supply that powers the computerized device, the backup power supply initially receiving charge from the main power supply, the method comprising the steps of:

preventing the backup power supply from receiving charge;

connecting, to the backup power supply, a discharge circuit that is different than circuitry of the computerized device; and while the backup power supply is connected to the discharge circuit, measuring an amount of time that the backup power supply provides an output signal meeting a predetermined criterion in order to determine whether the backup power supply is suitable for providing operating power to the computerized device for a predetermined amount of time in the event the main power supply no longer powers the computerized device.

2. The method of claim 1 wherein the predetermined criterion includes the backup power supply providing, as the output signal, an output voltage that exceeds a predetermined voltage threshold; wherein the discharge circuit is different than circuitry of a measuring circuit; and wherein the step of measuring includes the steps of:

recording a discharge start time and initiating discharging of the backup power supply through the discharge circuit; and recording a discharge end time when the measuring circuit indicates that the output voltage drops below the predetermined voltage threshold, the measured amount of time being a difference between the discharge end time and the discharge start time.

3. The method of claim 1 wherein the backup power supply is initially connected to the main power supply to receive charge from the main power supply, and wherein the step of preventing includes the step of:

disconnecting the backup power supply from the main power supply.

4. The method of claim 3 wherein the step of disconnecting the backup power supply from the main power supply includes the step of disconnecting the backup power supply from the computerized device, and wherein the method further comprises the step of:

connecting an auxiliary power supply to the computerized device to provide operating power to the computerized device in the event the main power supply no longer powers the computerized device.

5. The method of claim 1 wherein the discharge circuit includes a heating coil assembly, and wherein the step of connecting includes the step of:

forming a closed circuit between the heating coil assembly and the backup power supply.

6. The method of claim 5 wherein the discharge circuit further includes a fan assembly, and wherein the step of connecting further includes the step of:

forming a closed circuit between the fan assembly and the backup power supply such that the fan assembly provides an air stream across the heating coil assembly to cool the heating coil assembly.

7. The method of claim 1 wherein the step of measuring includes the step of:

recording an amount of time the backup power supply powers the discharge circuit while the backup power supply provides an output voltage over a predetermined voltage threshold, the output voltage provided by the backup power supply being the measured output signal of the backup power supply.

8. The method of claim 7 wherein the step of recording the amount of time includes the step of sensing the output voltage provided by the backup power supply using voltage detection circuitry under control by a computer, and wherein the method further comprises the step of:

storing the recorded amount of time in a database of the computer in an automated manner, the database including recorded amounts of time for other backup power supplies powering discharge circuits while the other backup power supplies provide output voltages over the predetermined voltage threshold.

9. An apparatus for testing a powerability characteristic of a backup power supply for a computerized device that is coupled to a main power supply that powers the computerized device, the backup power supply initially receiving charge from the main power supply, the apparatus comprising:

a discharge circuit that connects to the backup power supply when the backup power supply no longer receives charge from the main power supply, the discharge circuit being different than circuitry of the computerized device; and a measuring circuit that measures, when the backup power supply is connected to the discharge circuit, an amount of time that the backup power supply provides an output signal meeting a predetermined criterion in order to determine whether the backup power supply is suitable for providing operating power to the computerized device for a predetermined amount of time in the event the main power supply no longer powers the computerized device.

10. The apparatus of claim 9 wherein the discharge circuit includes:

a heating coil assembly that, when connected to the backup power supply, forms a closed circuit with the backup power supply.

11. The apparatus of claim 10 wherein the discharge circuit further includes:

a fan assembly that, when connected to the backup power supply, forms a closed circuit with the backup power supply such that the fan assembly provides an air stream across the heating coil assembly to cool the heating coil assembly.

12. The apparatus of claim 9 wherein the discharge circuit includes:

a fan assembly that, when connected to the backup power supply, forms a closed circuit with the backup power supply.

13. The apparatus of claim 9 wherein the measuring circuit includes a voltage detection circuit; and a computer coupled to the voltage detection circuit, the computer being configured to record an amount of time the backup power supply powers the discharge circuit while the backup power supply provides an output voltage over a predetermined voltage threshold, the output voltage provided by the backup power supply being the measured output signal of the backup power supply.

14. The apparatus of claim 13 wherein the computer includes:

memory having a database that stores amounts of time for other backup power supplies powering discharge circuits while the other backup power supplies provide output voltages over the predetermined voltage threshold; and a processor, coupled to the memory, that stores the recorded amount of time in the database of the memory.

15. The apparatus of claim 13 wherein the computer is configured to:

record a first time measurement when the discharge circuit connects to the backup power supply and when the output voltage of the backup power supply exceeds the predetermined voltage threshold;

record a second time measurement when the output voltage no longer exceeds the predetermined voltage threshold; and generate a difference between the first and second time measurements, the difference being an amount of time the backup power supply powered the discharge circuit while the backup power supply provided an output voltage over the predetermined voltage threshold.

16. An apparatus for testing a powerability characteristic of a backup power supply for a computerized device that is coupled to a main power supply that powers the computerized device, the backup power supply initially receiving charge from the main power supply, the apparatus comprising:

means for discharging the backup power supply when the backup power supply no longer receives charge from the main power supply, the means for discharging being different than circuitry of the computerized device; and a measuring circuit that measures, when the backup power supply is connected to the means for discharging, an amount of time that the backup power supply provides an output signal meeting a predetermined criterion in order to determine whether the backup power supply is suitable for providing operating power to the computerized device for a predetermined amount of time in the event the main power supply no longer powers the computerized device.

17. An apparatus for testing a powerability characteristic of a backup power supply for a computerized device that is coupled to a main power supply that powers the computerized device, the backup power supply initially receiving charge from the main power supply, the apparatus comprising:

a discharge circuit that connects to the backup power supply when the backup power supply no longer receives charge from the main power supply, the discharge circuit being different than circuitry of the computerized device; and means for measuring, when the backup power supply is connected to the discharge circuit, an amount of time that the backup power supply provides an output signal meeting a predetermined criterion in order to determine whether the backup power supply is suitable for providing operating power to the computerized device for a predetermined amount of time in the event the main power supply no longer powers the computerized device.

* * * * *